United States Patent [19]

Mizuta

[11] Patent Number: 5,047,988

[45] Date of Patent: Sep. 10, 1991

[54] DISPOSABLE IC MEMORY CARD HAVING AN EMBEDDED BATTERY

[75] Inventor: Masaharu Mizuta, Itami, Japan

[73] Assignee: Mitsubishi Denki Kabushiki Kaisha, Japan

[21] Appl. No.: 279,723

[22] Filed: Dec. 5, 1988

[30] Foreign Application Priority Data

Jun. 17, 1988 [JP] Japan .............................. 63-148154

[51] Int. Cl.[5] ............................................. G11C 5/14
[52] U.S. Cl. ................................... 365/229; 365/52;
307/296.4; 307/296.6; 235/492
[58] Field of Search ................ 365/52, 226, 228, 229,
365/189.09; 307/296.1, 296.4, 296.6; 323/312,
311; 235/492

[56] References Cited

U.S. PATENT DOCUMENTS

| 3,325,725 | 6/1967 | Nylander | 323/284 |
| 4,044,268 | 8/1977 | Hammel et al. | 307/66 |
| 4,857,756 | 8/1989 | Haneda | 307/66 |

FOREIGN PATENT DOCUMENTS

| 0070999 | 5/1980 | Japan | 365/226 |
| 0073720 | 4/1985 | Japan | 365/229 |
| 0259293 | 11/1987 | Japan | 365/228 |

OTHER PUBLICATIONS

Groves, Jr. et al., "Battery Back-Up with Defined Input Level", IBM Tech. Disc. Bull., vol. 26, No. 8, Jan. 1984, pp. 4136–4138.

"IC Memory Card Guideline", Nippon Denshi Kogyo Shinko Kyokai (pub. Sep. 1986), pp. 1–33.

Primary Examiner—Glenn Gossage
Attorney, Agent, or Firm—Leydig, Voit & Mayer

[57] ABSTRACT

A battery circuit including an embdedded battery is incorporated in a disposable integrated circuit (IC) memory card having a memory. The battery voltage is higher than a predetermined holding voltage needed for retaining stored data in the memory. The battery circuit includes an inductor-capacitor (LC) circuit; a switching circuit for connecting and disconnecting the battery and the inductor; and a level-detection/control circuit for detecting the voltage applied to the power input terminal of the memory and alternately connecting and disconnecting the switching circuit so that the voltage across the memory is maintained at or slightly above the predetermined holding voltage. Electrical power is intermittently supplied from the battery while an excess of electrical energy supplied from the battery is temporarily accumulated in the inductor. The voltage across the memory is maintained at the predetermined holding voltage, thereby remarkably reducing the rate at which the battery energy is consumed.

7 Claims, 7 Drawing Sheets

FIG. 1

FIG.2(a) CHANGE-OVER OPERATION OF TRANSISTOR 16

FIG.2(b) HOLDING VOLTAGE

DISPOSABLE IC MEMORY CARD HAVING AN EMBEDDED BATTERY

BACKGROUND OF THE INVENTION

This invention relates to a battery circuit adapted to control connection between a main circuit of an IC (integrated circuit) memory card or, more specifically, a random access memory card and a battery incorporated in the card.

Figure 3:
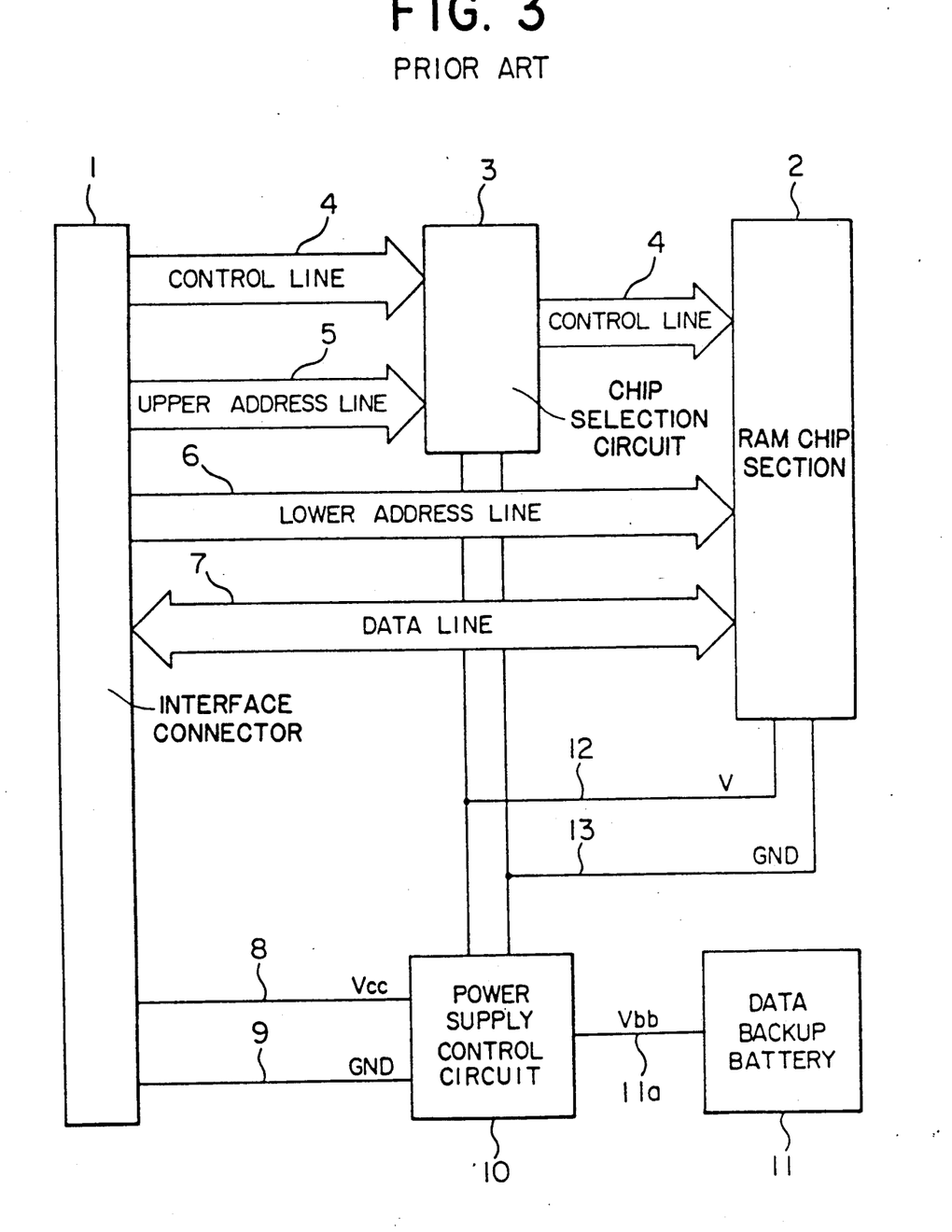
FIG. 3 block diagram of the construction of a conventional RAM card.

FIG. 3 shows a block diagram of the construction of a conventional random access memory card (hereinafter referred to as "RAM card") which is described in "IC Memory Card Guideline" published in Sept., 1986 by Nippon Denshi Kogyo Shinko Kyokai. Referring to FIG. 3, a RAM chip section 2 is ordinarily constituted by a plurality of RAM chips. An interface connector 1 is provided for connection to an external unit. A lower address line 6 and a data line 7 which extend from the interface connector 1 are connected to respective RAM chips in the RAM chip section 2. A control line 4 and an upper address line 5 which also extend from the interface connector 1 are connected to a chip selection circuit 3 for selecting a designated one of the RAM chips in the RAM chip section 2. The control line 4 further extends from the chip selection circuit 3 and is connected to respective RAM chips of the RAM chip section 2. Upper addresses are addresses for designating one of the RAM chips to be selected while lower addresses are addresses provided in each RAM chip. An external power supply line 8 indicated with Vcc and a ground line 9 indicated with GND extend from the interface connector 1. Power is supplied through the lines 8, 9 from a power source (not shown) to the RAM card via the interface connector 1 at a voltage Vcc. The lines 8, 9 are connected to a power supply control circuit 10. A power supply line 11a which extends from a data backup battery 11 incorporated in the RAM card to the circuit 10. Power from the battery 11 keeps data stored in the RAM chip section 2 during the time when the RAM card is detached from the IC card terminal and when it cannot be supplied with power from the outside. The power supply control circuit 10 supplies power from the external power source or the battery 11 to the RAM chip section 2 and to the chip selection circuit 3 via a power supply line 12 indicated with V and a ground line 13 indicated with GND.

Figure 4:
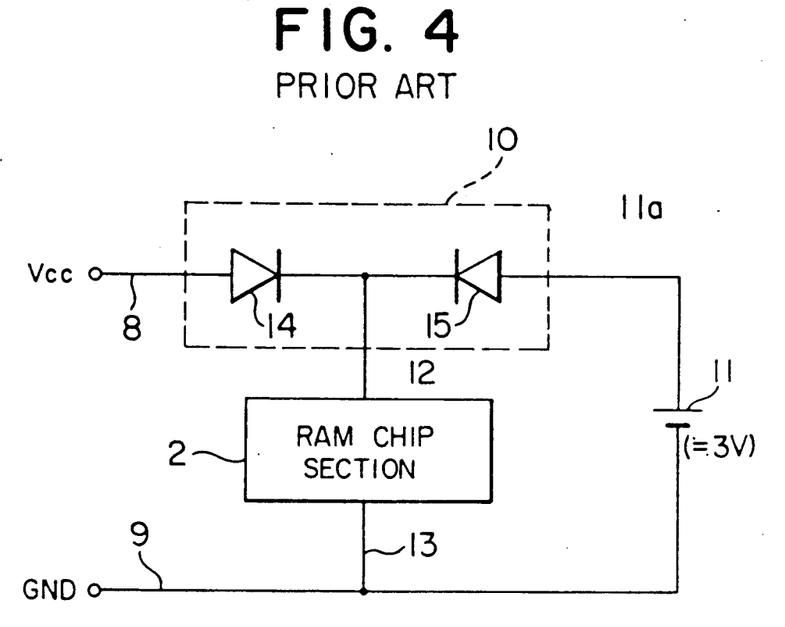
FIG. 4 is circuit diagram relating to fundamental functions of a section including the power source shown in FIG. 3.

FIG. 4 shows one of simplest examples of the arrangement of the power control circuit 10 and the data backup battery 11 of the RAM card shown in FIG. 3, in order to explain fundamental functions thereof. In FIG. 4, components identical to those shown in FIG. 3 are indicated by the same reference characters. There are provided a diode 14 for preventing a battery current leak from the battery 11 to the outside of the RAM card and a diode 15 for preventing a current from flowing into the battery 11 via the outside power supply line 8. The diodes 14 and 15 constitute the simplest example of the control circuit 10. The battery 11 is incorporated in the RAM card as shown in FIGS. 3 and 4 in order to maintain data stored in volatile RAM chips provided in the RAM card. The battery 11 may ordinarily be a lithium battery having an output level of about 3 V and having stable characteristics during long-time use, because the holding voltage necessary for backup operation for maintaining data in the RAM chips is at least about 2 V.

Figure 5:
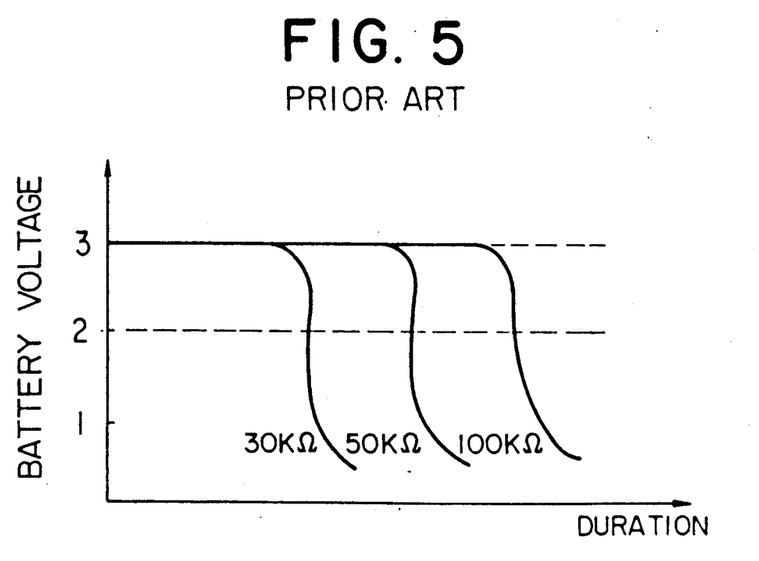
FIG. 5 is a graph of the relationship between the voltage and the duration of a battery.
Figure 6:
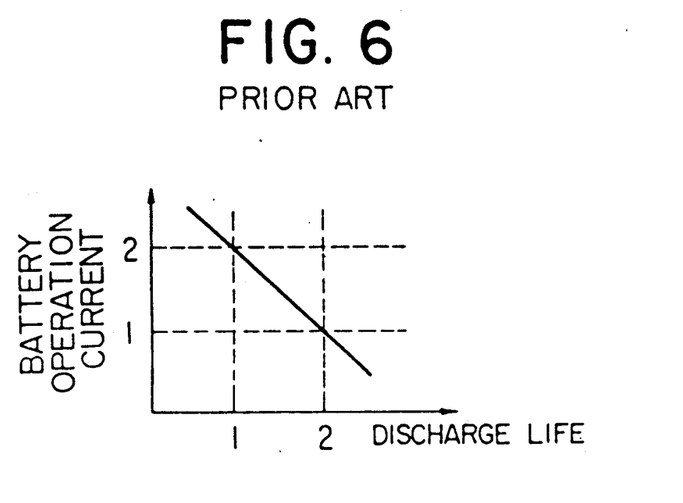
FIG. 6 is a graph of the relationship between the battery output current and the discharge life.

FIGS. 5 and 6 indicate battery characteristics. FIG. 5 shows discharge-load characteristics of a lithium battery with respect to the battery voltage (ordinate) and the duration (abscissa), and shows that the output voltage is constantly maintained at about 3 V for a certain initial duration time substantially irrespective of the number of memory chips, that is, the load corresponding to the whole of the RAM chip section 2 (e.g., 100 Ω, 50 Ω, or 30 Ω) but it abruptly decreases after a certain time has passed. FIG. 6 shows the relationship between the battery operation current (ordinate) flowing out of the battery and the discharge life (abscissa), and shows that if the battery operation current decreases to half, the discharge life, namely, the available time becomes doubled.

Figure 7:
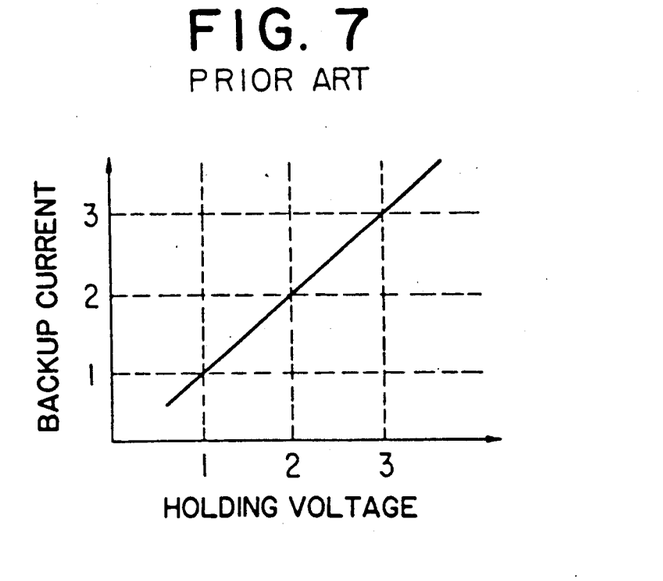
FIG. 7 is a graph of the relationship between the holding voltage for retaining stored data and the backup current.

FIG. 7 shows the relationship between a current (ordinate) ordinarily called a backup current necessary for retention of data in the RAM chips and a voltage ordinarily called a holding voltage (abscissa), and shows that if the holding voltage applied to the RAM chips is increased by times, the backup current is also increased by 1.5 times.

Recently, RAM cards have been designed to incorporate an increased number of RAM chips so as to constitute a memory of a larger capacity. The battery life is thereby reduced and, therefore, the majority of recent RAM cards are designed to be of the replaceable battery type. In the case of a type of large-capacity RAM card currently used, the battery life is about 0.7 year. If the life of batteries used in such RAM cards is increased, the user can use the card without anxiety.

The thus-constructed conventional large-capacity RAM card must be designed as the replaceable battery type. A RAM card of the replaceable battery type must be provided with a battery holder having a complicated structure together with a strong outer casing. Such a RAM card tends to malfunction due to failure in contact between the battery and a terminal or breakage of the terminal. In addition, an extra terminal for monitoring the reduction in the battery voltage to constantly observe the same to know the time when the battery should be replaced.

SUMMARY OF THE INVENTION

In view of these problems, it is an object of the present invention to greatly reduce the rate at which the battery energy is consumed in order to lengthen the interval at which the battery is replaced and, hence, enable the provision of a throwaway, embedded battery type of RAM card.

To this end, the present invention provides a disposable integrated circuit memory card having an internal power source for data backup including:
- a memory chip section having a power input terminal and a ground terminal connected to a common ground;
- a battery having a first terminal and a second terminal, embedded in the disposable IC card, and producing an output voltage at the first terminal relative to the second terminal higher than a predetermined holding voltage required to be applied to the power input terminal of the memory chip section for retaining stored dat ain the IC card;
- an inductance-capacitance circuit including a capacitor having a first terminal connected to the common ground and a second terminal connected to the power input terminal of the memory chip section through a diode for supplying a voltage to the memory chip section, an inductor having first and second terminals, the first terminal of the inductor being connected to the second terminal of said capacitor, and a diode having a cathode connected to the second terminal of the inductor and an anode connected to the common ground;

a switching circuit connected between the first terminal of the battery and the second terminal of the inductor for selectively connecting and disconnecting the first terminal of the battery and te second temrinal of the inductor; and a level-detection/control circuit for detecting the potential difference between the common ground and the power input terminal of the memory chip section and for controlling the switching circuit to alternately connect and disconnect the first temrinal of the battery and the second terminal of the inductor so that the potential difference is not less than the predetermined holding voltage wherein the switching circuit intermittently supplies electrical power to the inductance-capacitance circuit from the battery.

In accordance with the present invention, the level-detection/control circuit changes the duty ratio of the control pulse signal supplied to the change-over circuit to change the change-over operation between the on (closed) and off (opened) states thereof so that the voltage across the RAM chip section is maintained at the predetermined holding voltage (e.,g., 2 V) for retaining data stored in the RAM chip section.

DESCRIPTION OF PREFERRED EMBODIMENT

Figure 1:
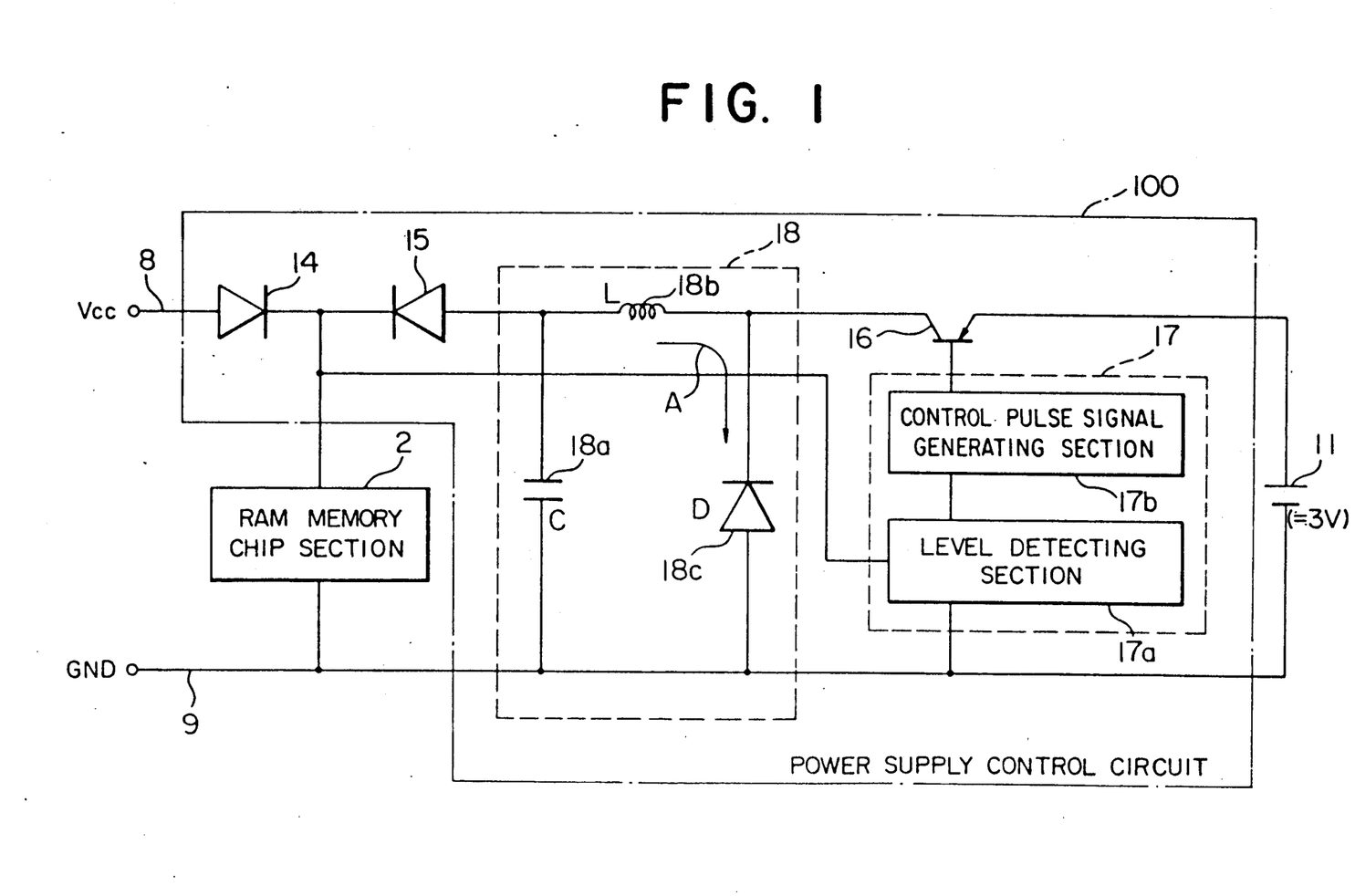
FIG. 1 is a circuit diagram of an IC card memory battery circuit which represents a first embodiment of the present invention.

An embodiment of the present invention will be described below with reference to the accompanying drawings. FIG. 1 shows a circuit diagram of an IC memory card battery circuit. In FIG. 1, components identical to those shown in FIG. 4 are indicated by the same reference characters. A power source control circuit 100 includes diodes 14 and 15 for inhibiting a current from flowing from the battery 11 into the external power supply line 8 as well as for inhibiting a current from flowing from the external power supply line 8 to the battery 11. Also a transistor changeover circuit 16 includes a transistor or the like to perform on/off change-over at a high speed. A level-detection/control circuit 17 constantly detects the potential difference between opposite end terminals of the RAM memory chip section 2 and supplies a control pulse signal to the transistor change-over circuit 16 with a suitable duty ratio to produce a certain holding voltage across the memory chip section (ordinarily about 2 V) for retaining data stored therein. An LC circuit (18) for temporarily accumulates an excess of electric energy supplied from the battery 11. The level-detection/control circuit 17 is includes by a level detecting section 17a for detecting the voltage across the RAM memory chip section 2, and a control pulse signal generating section 17b for outputting a control pulse signal to the transistor change-over circuit 16 with a suitable duty ratio to constantly maintain a voltage of about 2 V across the memory chip section 2 on the basis of the voltage detected by the level detecting section 17a. The LC circuit 18 includes a capacitor 18a connected between ground and the RAM memory chip section 2, an inductor L having first and second terminals connected to the capacitor 18a at the first terminal thereof and a diode 18c grounded at its anode and connected at its cathode to the inductor L at the second end thereof which prevents a current from flowing in the direction of the arrow A in FIG. 1 without supplying electromagnetic energy accumulated in the reactor 18b to the capacitor 18a when the transistor change-over circuit 16 is in an off (opened) state.

Figure 2A:
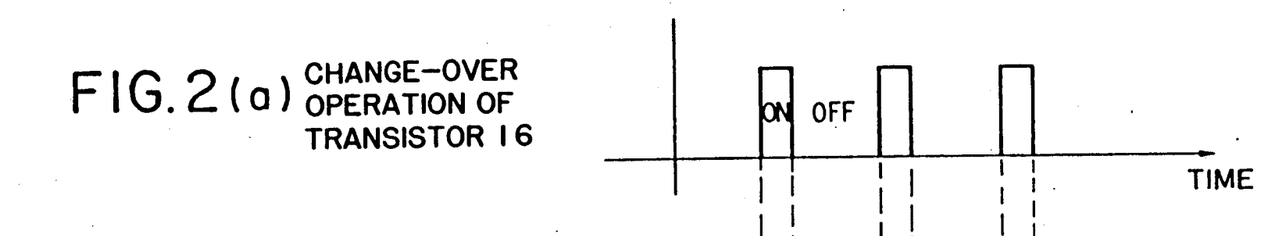
FIG. 2 waveform diagram illustrating the operation of the circuit shown in FIG. 1.
Figure 2B:
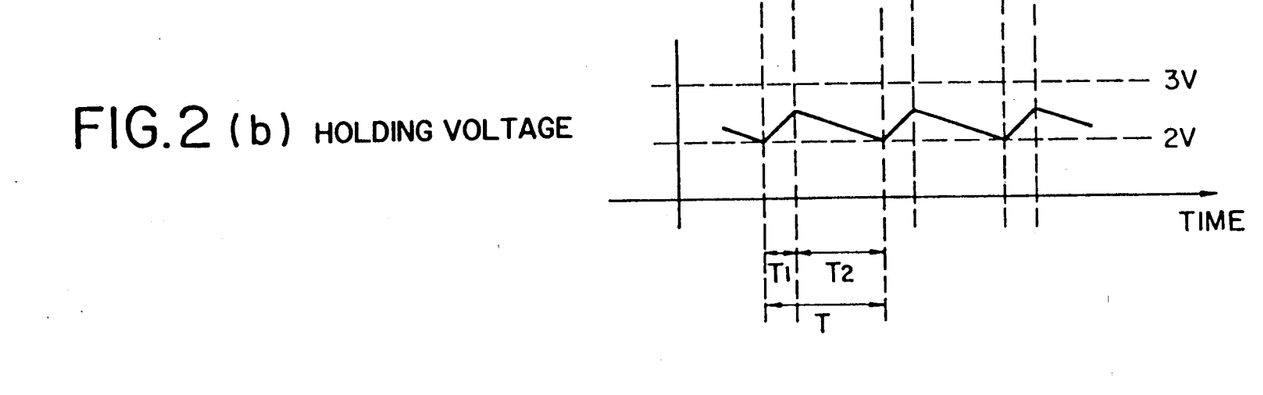

Waveforms (a) and (b) of FIG. 2 are waveform diagram sof the operations of the circuit shown in FIG. 1; Waveform (a) is a waveform diagram illustrating states of the operation of the transistor change-over circuit 16; and Waveform (b) is a waveform diagram of the voltage across the capacitor 18a, that is, the holding voltage applied to the opposite end terminals of the RAM chip section 2. In FIG. 2, a period T represents the period of on/off operation of the transistor change-over circuit 16 under the control of the level-detection/control circuit 17, a period $T_1$ corresponds to a period of time during which the transistor change-over circuit 16 is switched on (closed), and a period $T_2$ corresponds to a period of time during which the transistor change-over circuit 16 is switched off (opened). The ratio of $T_1$ and $T_2$, namely, the duty ratio is controlled by the level-detection/control circuit 17. The level-detection/control circuit 17 operates the transistor change-over circuit 16 with a constant duty ratio during a steady state, or it changes the duty ratio of the control pulse signal supplied to the transistor change-over circuit 16 so as to constantly maintain the holding voltage across the RAM chip section 2 at 2 V if the output voltage of the battery becomes changed. In fact, the holding voltage applied to the RAM chip section 2 changes between 2 V and a level slightly higher than 2 V in response to the on/off operation of the transistor change-over circuit 16. During the above periods, the LC circuit 18 operates as described below briefly. During the period $T_1$ of the on (closed) state of the transistor change-over circuit 16, the inductor 18b is temporarily charged with an amount of electromagnetic energy corresponding to a voltage 3 V−2 V =1 V supplied from the battery 11. During the period $T_2$ of the off (opened) state of the transistor change-over circuit 16, electromagnetic energy charged in the inductor 18b is supplied to the capacitor 18a.

Thus, in the above-described arrangement, the level-detection/control circuit 17 controls the mean value of the voltage across the capacitor 18a by changing the duty ratio of the on and off periods of the operation of the transistor change-over circuit 16 so that the holding voltage corresponding to the voltage across the capacitor 18a and applied to the RAM memory chip section 2 is constantly maintained at a level of about 2 V or, in an actual state, changes between 2 V and a level slightly higher than 2 V.

During the period $T_2$ of the off (opened) state of the transistor change-over circuit 16, the battery 11 is not discharged while electromagnetic energy stored in the inductor 18b during the period $T_1$ of the on (closed) state is supplied to the capacitor 18a, thereby continuously applying the holding voltage of 2 V to the RAM memory chip section 2. That is, energy corresponding to 3 V−2 V=1 V during the on (closed state) of the transistor changeover circuit 16 is effectively used during the next off (opened) state.

If the battery voltage of 3 V higher than the level of 2 V necessary for data retention is directly applied to the RAM chip section 2, an excessive backup current flows, resulting in a serious reduction in the life of the battery [unit: mAH (milliampere hour)]. That is, as is apparent from FIGS. 5 to 7, if a holding voltage of about 2 V can be applied to the RAM memory chip section 2, a backup current flowing into the RAM section 2 is about two thirds of the backup current supplied by the voltage of 3 V. Correspondingly, the output current of the battery is reduced to two thirds and the discharge life of the battery is increased by 1.5 times.

In accordance with the present invention, to apply the holding voltage to the RAM chip section 2, the LC circuit 18 is temporarily charged with an excess of electric energy instead of using the battery 11 and having a constant and stable output voltage of about 3 V and thereby directly applying this voltage as the holding voltage. That is, the capacitor 18a is directly charged by the battery 11 and is indirectly charged by the reactor 18b, and a voltage varying between a smaller level of 2 V for a smaller battery output current and a level slightly higher than 2 V is applied to the RAM chip section 2. This is achieved by processing in which the level-detection/control circuit 17 changes the duty ratio of the control pulse signal supplied to the transistor change-over circuit 16 and, hence, the ratio of the periods of the on and off states of this circuit.

Figure 8:
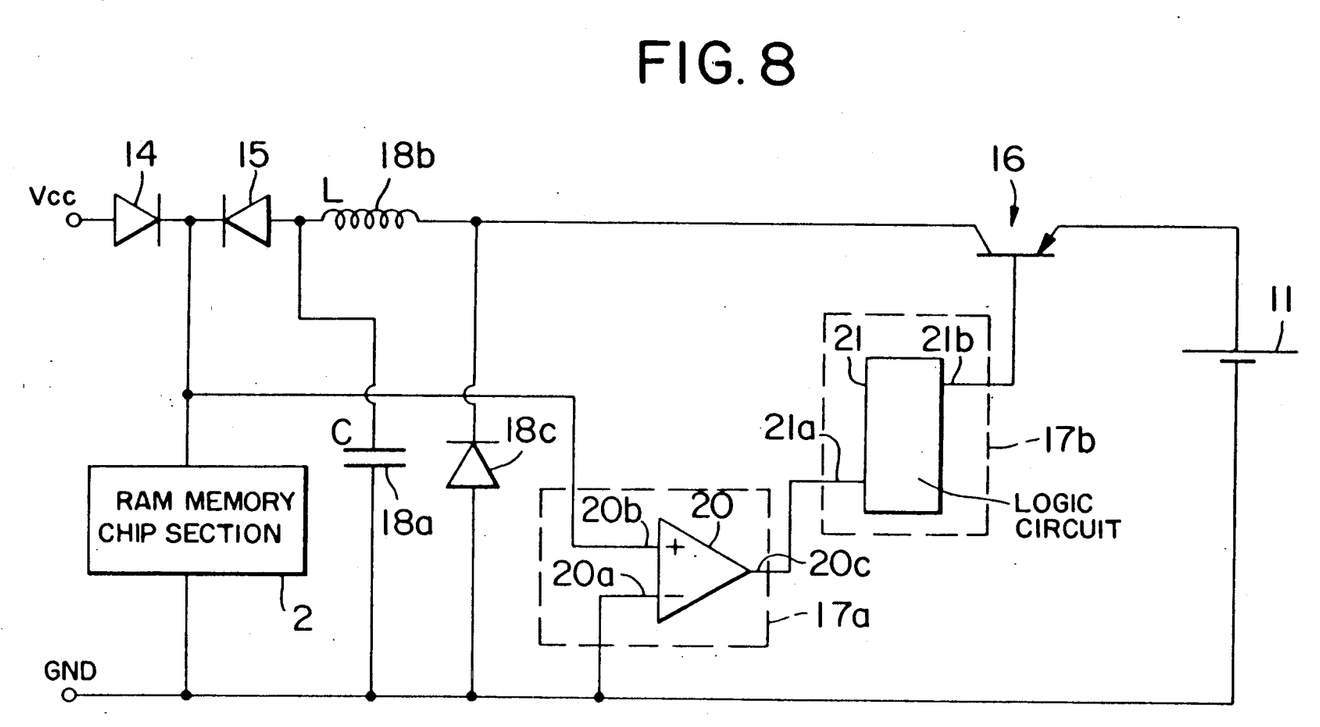
FIG. 8 is a circuit diagram of an IC card memory battery circuit according to the present invention.

As described above, the voltage applied to the RAM chip section 2 is set within a range between a level of about 2 V and a level slightly higher than 2 V. Electric energy corresponding to 3 V−2 V=1 V is effectively used, and the battery output current flowing out of the battery 11 becomes smaller than the current input into the RAM chip section 2 by a level corresponding to a reduction in the applied voltage, thereby making the life of the battery longer than that in the case of the conventional RAM card in which the battery is simply used at 3 V. The Level-detection/control detecting section 17a may include a differential amplifier, while the control pulse signal generating circuit section 17b may include a high-efficiency, low-power-consumption logic circuit formed as a variable duty ratio type of pulse generator. This circuit may be supplied with power from the battery 11 or the capacitor 18a. FIG. 8 shows an example of a level-detection/control; circuit 17 including a differential amplifier 20 and a high-efficiency low-powr-consumption logic circuit 21 as described above. The differential amplifier 20 has a first input 20a connected to the grounded side of the RAM memory chip section 2 through the common ground GND and a second input 20b connected to receive the voltage applied to the power input of the memory chip section 2. An output 20c of the differential amplifier 20 is connected to an input 21a of the logic circuit 21. An output 21b of the logic circuit 21 is connected to the base of the transistor 16.

Figure 9:
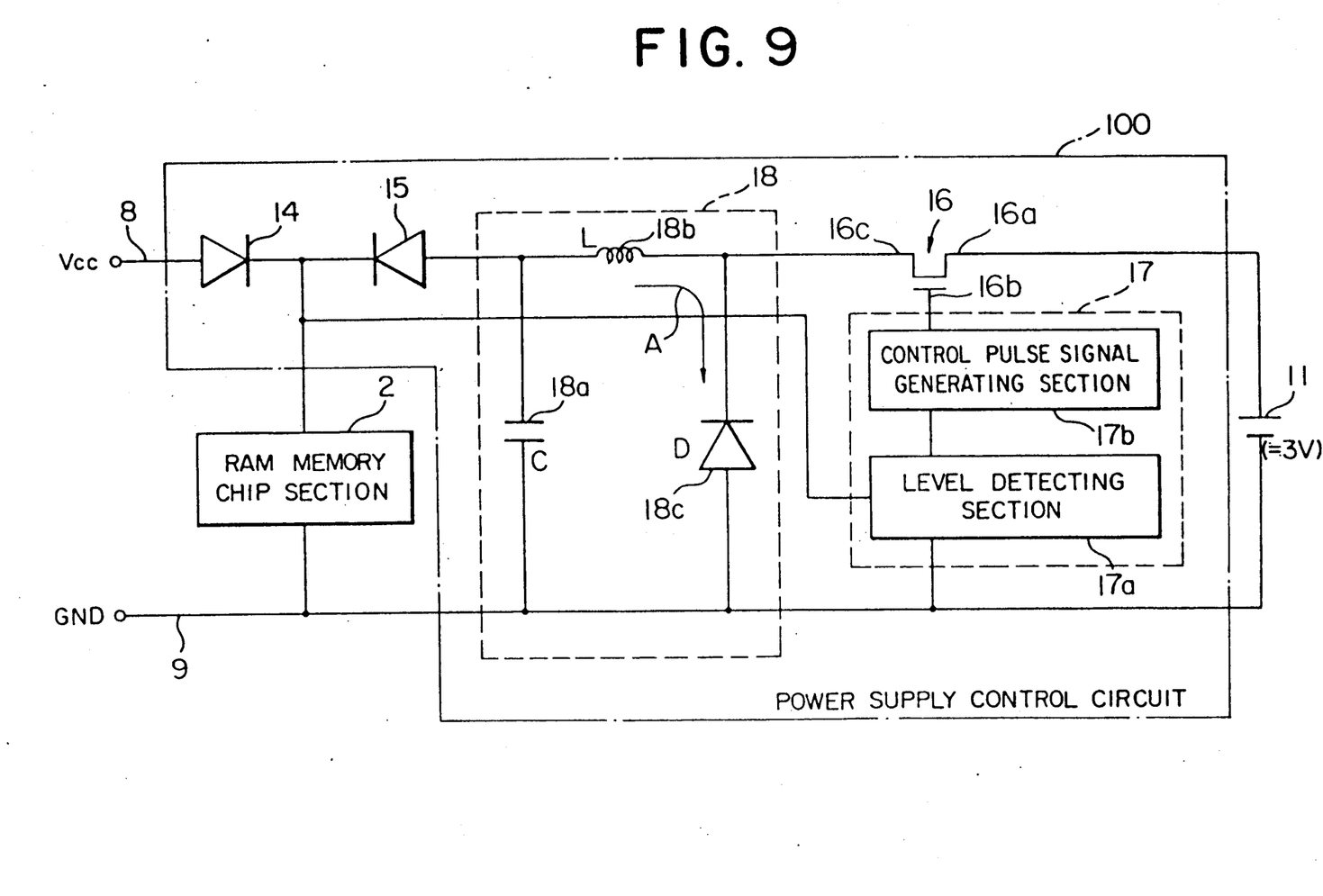
FIG. 9 is a circuit diagram of an IC card memory battery circuit according to the present invention.

The transistor change-over circuit 16 may alternatively include an FET (field effect transistor) switch or the like. FIG. 9 shows a circuit diagram substantially similar to that of FIG. 1. The only different is that the bipolar transistor of change-over circuit 16 has been replaced by a field effect transistor. The field effect transistor includes a drain 16a connected to the battery 11, a gate 16b connected to the control pulse signal generating section 17b of the level-detection/control circuit 17, and a source 16c connected to the LC circuit 18. Since comparable terminals of the FET are connected to the points at which the terminals of the bipolar transistor were connected, substantially the same functionality is achieved.

In accordance with the present invention, as described above, the level detection/control circuit changes the duty ratio of the control pulse signal supplied to the transistor change-over circuit which intermittently connects the battery to the LC circuit in which the capacitor connected between ground and the ROM chip section temporalily accumulates an excess of electric energy supplied from the battery, in such a manner that the voltage across the capacitor changes between the level of 2 V necessary for chip selection and a level slightly higher than 2 V. The life of the battery thereby becomes longer than that in the case of the conventional RAM card in which the battery is simply used at the standard voltage (e.,g., 3 V). The present invention thus makes it possible to design an IC memory card battery circuit with an increased battery change interval, a RAM card in which this battery circuit is incorporated and, hence, a throwaway, embedded battery type of RAM card. Further the present invention is applicable to not only the RAM card but also any card which incorporates a battery.

What is claimed is:

1. A disposable IC (integrated circuit) memory card having an internal powe source for data backup comprising:
    a memory chip section for storing data and having a power input temrinal and a ground terminal, the ground terminal being connected to a common ground;
    a battery having a first terminal and a second terminal, embedded in said disposable IC card, and producing an output voltage at the first terminal relative to the second terminal higher than a predetermined holding voltage required to be applied to the power input terminal of said memory chip section to retain stored data in said IC card;
    an LC (inductance-capacitance) circuit including a capacitor having a first terminal connected to the common ground and a second terminal connected to the power input terminal of said memory chip section through a diode for supplying a voltage to said memory chip section, an inductor having first and second terminals, the first terminal of the inductor being connected to the second terminal of said capacitor, and a diode having a cathode conencted to the second temrinal of said inductor and an anode connected to the common ground;

a switching circuit connected between the first terminal of said battery and the second terminal of said inductor for selectively connecting and disconnecting the first terminal of said battery and the second terminal of said inductor; and a level-detection/control circuit for detecting the potential difference between the common ground and the power input terminal of said memory chip section and for controlling said switching circuit to alternately connect and disconnect the first terminal of said battery and the second terminal of said inductor so that the potential difference is not less than the predetermined holding voltage wherein said switching circuit intermittently supplies electrical power to said LC circuit from said battery.

2. The IC card according to claim 1 wherien said level-detection/control circuit comprises a differential amplifier for detecting the potential difference and a control pulse signal generating section includign a variable duty ratio type of pulse generator including a high-efficiency, low-power-consumption logic circuit, said control pulse generating section supplying a variable duty cycle control pulse signal to said switching circuit for maintaining the potential difference at at least the predetermined holding voltage in response to an output of said level detecting section.

3. The IC card according to claim 2 wherein said switching circuit includes a bipolar transistor switch having an emitter connected to the first terminal of said battery, a base connected to receive the control pulse signal from said control pulse signal generating section, and a colelctor connected to the second terminal of said inductor for switching at a high speed.

4. The IC card according to claim 2 wherien said switching circuit includes a field effect transistor having a drain connected to the first terminal of said battery, a gate connected to receive the control pulse signal from said control pulse signal generating section, and a source connected to the second terminal of said inductor for switching at a high speed.

5. The IC card according to claim 2, wherein said memory chip seciton includes at least one random access memory chip.

6. The IC card according to claim 5 wherein said switching circuit includes a bipolar transistor having an emitter connected to the first terminal of said battery, a base connected to receive the control pulse signal from said control pulse signal generating section, and a collector connected to the second terminal of said inductor for switching at a high speed.

7. The IC card according to claim 5 wherein said switching circuit includes a field effect transistor having a drain connected to the first terminal of said battery, a gate connected to receive the control pulse signal from said control pulse signal generating section, and a source connected to the second terminal of said inductor for switching at a high speed.

* * * * *

UNITED STATES PATENT AND TRADEMARK OFFICE
CERTIFICATE OF CORRECTION

PATENT NO. : 5,047,988

DATED : September 10, 1991

INVENTOR(S) : Masaharu Mizuta

It is certified that error appears in the above-identified patent and that said Letters Patent is hereby corrected as shown below:

Column 6, line 45, change "powe" to --power--;

line 48, change "temrinal" to --terminal";

lines 66 and 67, change "conencted" to
                      --connected--;
                      change "temrinal" to
                      --terminal--.

Column 7, line 16, change "wherien" to --wherein--;

line 19, change "includign" to --including--;

Column 8, line 3, change "colelctor" to --collector--;

line 5, change "wherien" to --wherein--;

line 13, change "seciton" to --section--.

Item No. [57], Abstract, line 1, change "embdedded" to
                               --embedded--.

Signed and Sealed this

Second Day of March, 1993

*Attest:*

STEPHEN G. KUNIN

*Attesting Officer*            *Acting Commissioner of Patents and Trademarks*